United States Patent [19]

Mosconi et al.

[11] Patent Number: 4,644,181

[45] Date of Patent: Feb. 17, 1987

[54] AUTOMATIC LOCKING DEVICE FOR LINKAGES SUBJECTED TO UNDESIRABLE MECHANICAL STRESSES, APPLICABLE IN PARTICULAR TO ELECTRICAL SWITCHES

[75] Inventors: Pierbattista Mosconi; Renato Dosmo, both of Bergamo, Italy

[73] Assignee: SACE S.p.A. Costruzioni Elettromeccaniche, Bergamo, Italy

[21] Appl. No.: 584,150

[22] Filed: Feb. 27, 1984

[30] Foreign Application Priority Data

Mar. 10, 1983 [IT] Italy ............................. 20010 A/83

[51] Int. Cl.[4] .................... H01L 410/04; H01H 35/14

[52] U.S. Cl. .................................. 361/119; 310/329; 310/338; 340/665; 340/668

[58] Field of Search ....................... 307/119, 121, 124; 200/61.5, 668, 815.29; 361/143, 160, 170, 130; 336/130; 310/329, 338

[56] References Cited

U.S. PATENT DOCUMENTS

| | | | |
|---|---|---|---|
| 3,233,465 | 2/1966 | Tolliver et al. | 73/517 |
| 3,612,966 | 10/1971 | Ogbel | 361/170 |
| 3,810,145 | 5/1974 | Gusaras | 340/665 X |
| 3,843,898 | 10/1974 | Maciag | 310/338 X |
| 4,130,624 | 12/1978 | Walker | 310/338 X |
| 4,225,802 | 9/1980 | Suzuki et al. | 310/329 X |
| 4,319,146 | 3/1982 | Wires, Sr. | 361/170 X |

FOREIGN PATENT DOCUMENTS

| | | |
|---|---|---|
| 1135550 | 8/1962 | Fed. Rep. of Germany . |
| 537195 | 6/1941 | United Kingdom . |
| 551085 | 2/1943 | United Kingdom . |

*Primary Examiner*—Philip H. Leung
*Assistant Examiner*—Derek S. Jennings
*Attorney, Agent, or Firm*—Diller, Ramik & Wight

[57] ABSTRACT

An automatic locking device for linkages subjected to undesirable mechanical stresses comprises a transducer with transmits an electrical signal as a function of the mechanical stress received, and feeds it to a coil which generates an electromagnetic field causing locking of the linkage.

7 Claims, 7 Drawing Figures

AUTOMATIC LOCKING DEVICE FOR LINKAGES SUBJECTED TO UNDESIRABLE MECHANICAL STRESSES, APPLICABLE IN PARTICULAR TO ELECTRICAL SWITCHES

BACKGROUND OF THE INVENTION

This invention relates to an automatic locking device for linkages subjected to undesirable mechanical stresses, whichis particularly applicable for example to the opening release devices used in electrical switches.

It is known that a linkage subjected to mechanical stresses such as impact, vibration, acceleration etc. of sufficient intensity and suitable direction is able to undergo movement.

In many cases this movement is undesirable, and leads to the functioning of the system in which the linkage is inserted, the result being untimely and sometimes unacceptable operation.

Electrical switches installed in structures susceptible to high stress are usually provided with locking devices for the release linkage, in order to prevent involuntary opening of the contacts due to undesirable mechanical stress.

These locking devices are of mechanical type. One type comprises for example a ball elastically held between two jaws, to produce by the effect of impact a mechanical action which is able to lock the linkage for opening the switch contacts. In practice, on impact, the ball moves from its rest position and causes the two jaws to diverge, thus preventing movement of the release system and locking it.

However in the particular case of an overcurrent release device, when in this locked position even if a release control signal due to an overload acts simultaneously with the impact stress, it is possible for the release device to be unable to operate and cause opening of the switch contacts. This represents a drawback.

Furthermore, a negative characteristic typical of these known mechanical locking devices is their response time to mechanical stresses. This time is relatively high and is due to the need for the sensing mass (the ball) to undergo a finite displacement sufficient to move the mechanical locking elements (the two jaws).

This can be particularly disadvantageous in those applications which use electromagnetic releases with a switch opening device in the form of a solenoid which is retained in position by a permanent magnet field, and is operable by an electrical demagnetisation pulse.

Such opening solenoids are known to comprise an armature which operates the switch release lever. This armature is held in its "set" position by a permanent magnet and simultaneously loads an operating spring. A very small displacement of the armature from its "set" position is sufficient to enable the spring to prevail over the permanent magnet force, so as to cause the armature to move rapidly until it operates the switch release lever. In the absence of impact, such a displacement can be obtained merely by an electromagnetic pulse force acting against the permanent magnet force and generated by a coil energised by the output signal from overcurrent sensors.

It therefore follows that even impacts of a not particularly high intensity are able to cause the release device to involuntarily operate.

The intervention action of present-day mechanical locking devices is however not sufficiently rapid to anticipate the release device, because of the rapidity of the elastic snap-action of the armature in contrast to the high inertia of the mechanical locking device.

The ideal solution would be a locking device which is so rapid as to not enable the armature to make even a minimum movement, because if this were not the case once the effect of the impact and thus the intervention of the locking device has ceased, the armature, under the action of the spring, would continue its movement until it operated the release lever, even if a signal from the overcurrent sensors were not present.

SUMMARY OF THE INVENTION

The object of the present inventin is to obviate the aforesaid drawbacks, and generally to provide an automatic locking device having a high response speed and a behaviour which is reliable and constant with time.

This object is obtained according to the invention by an automatic locking device for linkages subjected to undesirable mechanical stresses, characterized by a transducer 10 rigid with the mechanical structures on which the linkage is disposed, to emit an electrical signal which is a function of the mechanical stress received, and a coil 13 fed by said transducer 10 to generate an electromagnetic field which causes locking of the linkage.

The structure of such a device, which is based on the use of a terminal coil able to generate an electromagnetic force which is a function of the undesirable mechanical stress, makes is advantageously applicable to all release systems of electromagnetic type used in electrical switches.

The characteristics and advantages of the present invention will be more apparent from the description given by way of non-limiting example of some embodiments thereof which are illustrated on the accompanying drawings in which:

DESCRIPTION OF THE PREFERRED EMBODIMENTS

Figure 1:
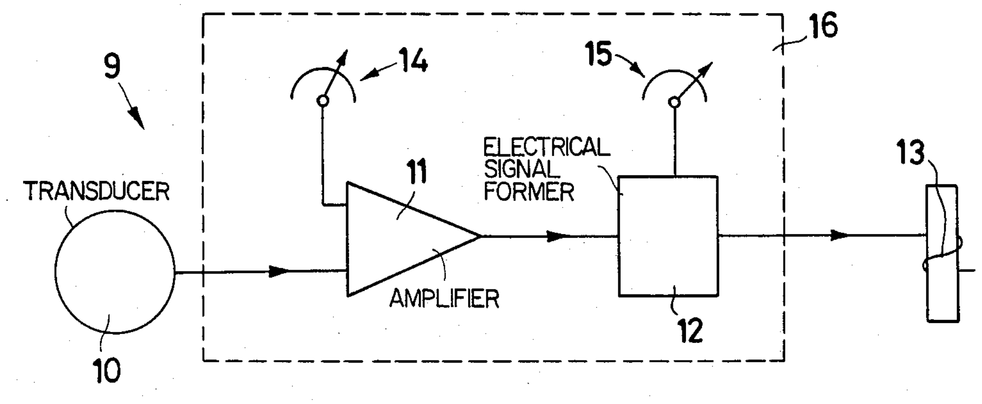
FIG. 1 is a general diagrammatic representation of a locking device for stressed linkages according to the invention.

The device of FIG. 1, indicated overall by 9, comprises a transducer 10 rigid with the mechanical structures on which the linkage is disposed. It is able to supply an electrical output signal which is a function of the mechanical stress received. A transducer of piezoelectric type can for example be used. The output signal from the transducer 10 is fed to an amplifier 11, and from here to an electrical signal former 12 which suitably feeds a coil 13. When fed, the coil 13 generates an electromagnetic force which can be used in various ways for locking any linkage (not shown in FIG. 1).

The device 9 also comprises a regulator 14 for setting the mechanical stress level at which the device is to activate, and a regulator 15 for setting the duration of the locking effect.

The electronic component of the device 9, constituted by the amplifier 11, the former 12 and the two regulators 14 and 15, is indicated overall by 16.

Figure 2:
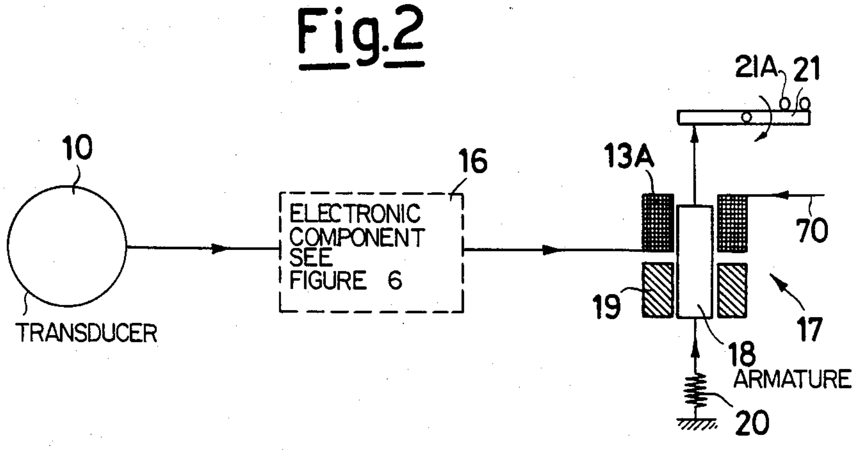
FIG. 2 shows a first application of the device of FIG. 1.

FIG. 2 is a diagrammatic illustration of an important application of the device 9 in the electrical switch field, and relates to an overcurrent release device 17 of the demagnetisation type, already described in the introduction.

As already stated, the release device 17 comprises an operating armature 18 retained in its "set" position by a permanent magnet 19 against a thrust spring 20. If overcurrent occurs in the circuit in which the electrical switch is connected, a coil 13A is fed by way of suitable overcurrent sensors, to generate an electromagnetic force which unbalances the two forces acting on the armature 18 by an extent sufficient to induce a slight displacement of the armature from its "set" position, and thus cause the elastic force of the thrust spring 20 to prevail. The armature 18 moves to operate a lever 21 for releasing the main switch contacts 21A (this operating feed for the armature 18 is shown diagrammatically by an arrow 70).

In the illustrated embodiment, the coil which releases the armature 18 is the same coil, indicated by 13A, as that used as the locking element in the device according to the invention, as will be apparent hereinafter.

Figure 6:
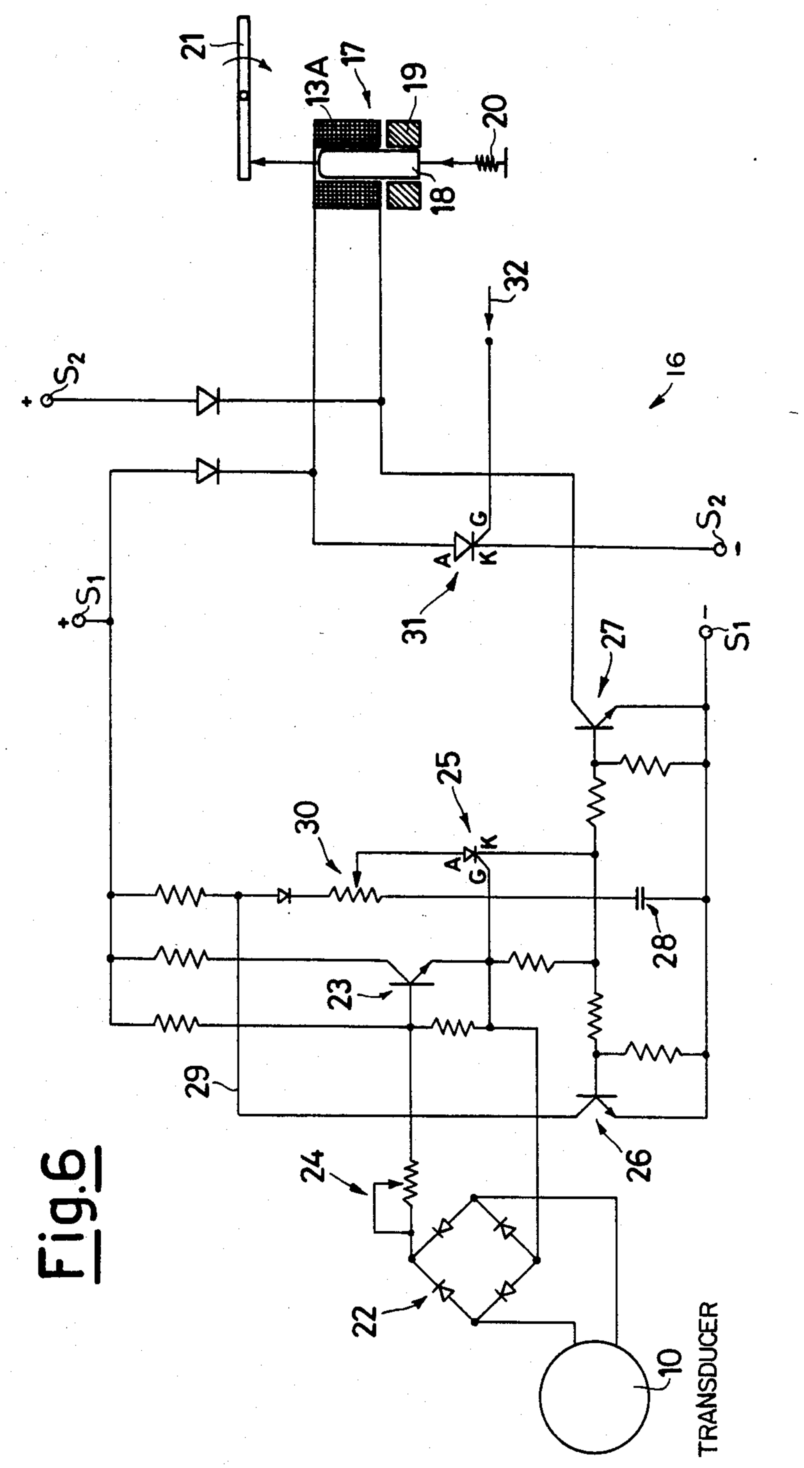
FIG. 6 is a detailed diagram of the circuit of FIG. 2.

FIG. 6 is a detailed illustration of the circuit diagram (electronic component 16) of the embodiment of FIG. 2.

The electrical output signal from the transducer 10 is fed by way of a diode rectifier bridge 22 to a transistor 23 fed by a source of direct current $S_1$. The rectifier bridge 22 applies a positive polarity to the base relative to the emitter of the transistor 23, independently of the sign of the signal from the transducer 10. A potentiometer 24 adjustably limits the intensity of the signal applied to the base of the transistor 23.

When this signal exceeds a determined value, the transistor 23 becomes conducting and triggers a controlled diode 25 (electronic switch) by way of the gate G. The current flowing between the anode A and cathode K of the controlled diode 25 causes two further transistors 26 and 27 to conduct.

In this circuit situation in which the controlled diode 25 and the two transistors 26 and 27 conduct, a capacitor 28 discharges. In this respect, under normal conditions, ie when the circuit is not activated by a signal from the transducer 10, the capacitor 28 is charged and kept charged by the source $S_1$. When the circuit is activated, the feed voltage to the capacitor 28 is reduced almost to zero by way of a branch 29 and the conducting transistor 26. The capacitor 28, which is no longer fed with electricity, thus discharges.

The discharge current of the capacitor 28 keeps the controlled diode 25 and the two transistors 26 and 27 conducting, for the time during which its value is sufficient to keep these circuit elements activated. The duration of the discharge can be regulated by means of a potentiometer 30.

For the entire conducting period of the transistor 27, the coil 13A is fed by the source $S_1$ by way of a collector-emitter junction of said transistor 27. The direction of flow of the current through the coil 13A is such as to create an electron magnetic force which adds to the force of the permanent magnet 19.

The coil 13A is also connected by way of a controlled diode 31 (electronic switch) to a second direct current source $S_2$ with an output voltage greater than the source $S_1$. The controlled diode 31 is triggered by a release signal indicated diagrammatically by an arrow 32 and fed by the overcurrent sensors, not shown, to its gate G. When the diode 31 is triggered, the feed voltage of the source $S_2$ determines in the coil 13A a current circulating in the opposite direction to that caused by the source $S_1$, and thus generates an electromagnetic force which subtracts from the force of the permanent magnet 19.

In the absence of impact or overcurrent in the switch comprising the device of FIG. 2, the armature 18 is retained in its "set" position by the force of the permanent magnet 19 which acts against and prevails over the force of the spring 20.

In the case of overcurrent in the switch, the overcurrent sensors feed the release signal 32, which triggers the controlled diode 31. The electromagnetic force created by the coil 13A supplied by the source $S_2$ opposes the magnetic field of the permanent magnet 19 to enable the force of the spring 20 to prevail over the force of the permanent magnet, to release the armature 18, which moves under the action of the spring 20 until it operates the lever 21 and opens the main switch contacts.

In the case of impact against the switch and thus against the transducer 10 rigid therewith, this latter emits an electrical output signal and thus, as is apparent from the aforegoing explanation, the armature is retained in its "set" position by a supplementary magnetic force which is added to that due to the permanent magnet 19, so as to prevent even small movements of the armature 18 taking place, or to return it to its "set" position in the case of a particularly large stress.

If an impact and overcurrent are simultaneously present in the switch, the coil 13A is traversed in one direction by the current determined by the voltage of the source $S_1$ (impact) and in the other direction by the current determined by the voltage of the source $S_2$ (overload), this latter voltage being greater than the preceding. There is thus a resultant electromagnetic force in the reverse direction to the force determined by the permanent magnet 19, so that the armature 18 is released and the main switch contacts open.

The priority requirement of opening the main switch contacts n the case of overcurrent, independently of whether the swtich is or is not subjected to stress, explains the need for an output voltage from the source $S_2$ which is always greater than the output voltage from the source $S_1$.

The purpose of the potentiometer 24 of the circuit of FIG. 6 is to adjust the mechanical stress level at which the device is to activate (regulator 14 of FIG. 1). The purpose of the potentiometer 30 is to adjust the duration of the locking effect on the armature 18 (regulator 15 of FIG. 1).

Single transistors are used in the proposed circuit diagram. It is however obviously possible to use more complex transistor functions such as Darlington transistors or equialent integrated circuits.

Figure 3:
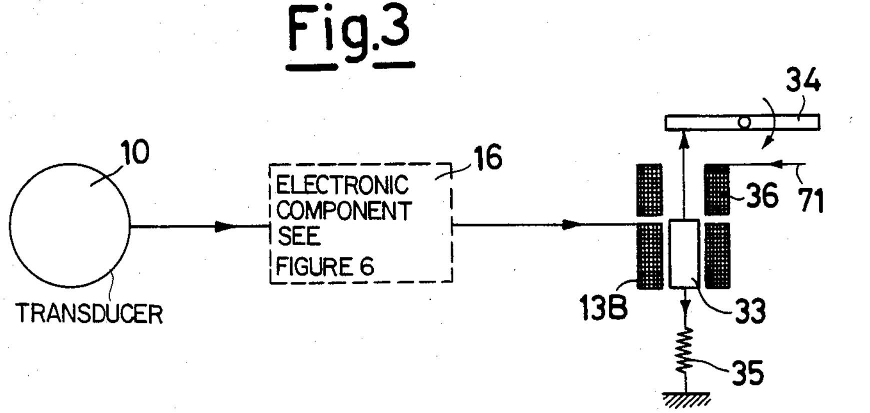
FIG. 3 shows a second application of the device of FIG. 1.

FIG. 3 is a diagrammatic illustration of an application of the device 9 relative to another type of electromagnetic overcurrent release system which, as in the preceding system of FIG. 2, comprises an armature 33 which an overcurrent operates a lever 34 for releasing the main switch contacts. However in contrast to the preceding release device of FIG. 2, the armature 33 is kept in its rest position by a return spring 35 and is driven against the lever 34 by the electromagnetic force created by a coil 36 which is fed under the control of the overcurrent sensors (this operating feed for the armature 33 is shown diagrammatically by an arrow 71).

In this application, the coil of the device according to the invention, indicated by 13B, creates on impact an electromagnetic force which adds to the elastic force of the spring 35 in retaining the armature 33 in its rest position.

The electromagnetic force created by the coil 36 (ie only in the presence of an overload) must always have a value greater than the forces created by the coil 13B (impact) and by the spring 35, and must be sufficient to drive the armature 33 in opposition to these two forces whenever mechanical stresses and overcurrent are simultaneously present in the switch, as already seen for the release device of FIG. 2.

The simple circuit of FIG. 6 can be used for the electronic component 16, but obviously the supply line relative to the source $S_1$, which has to serve the coil 13B, has to be separated from the supply line relative to the source $S_2$, which has to serve the coil 36, in contrast to the preceding application where a single coil (coil 13A) had to be fed.

Figure 4:
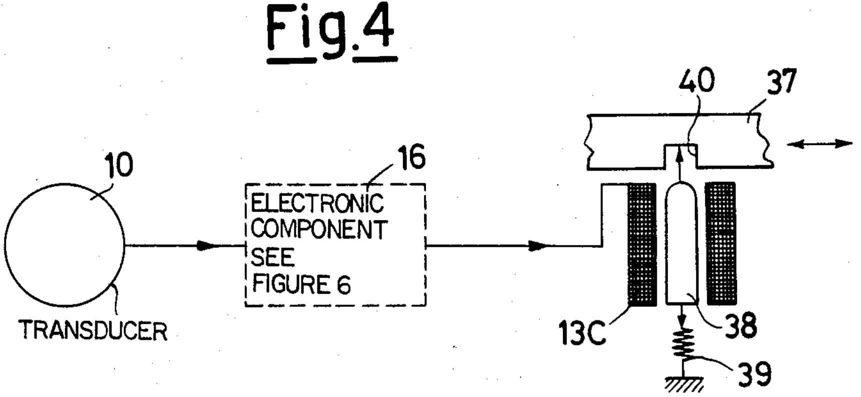
FIG. 4 shows a third application of the device of FIG. 1.

FIG. 4 diagrammatically illustrates a further application of the device 9, for locking a linearly mobile slider 37 which has to maintain its position constant even under impact. For this application, the device 9 also comprises a pin-shaped armature 38 held in its rest position by a return spring 39.

In the case of mechanical stress, the coil of the device 9, indicated by 13C, generates an electromagnetic force which causes the pin 38 to snap into a cavity 40 in the slider 37, so as to lock it.

It is also possible for this application to use a circuit analogous to the circuit of FIG. 6, but in which only one direct current source operates to energise the coil 13C at the appropriate moment, such as $S_1$.

Figure 5:
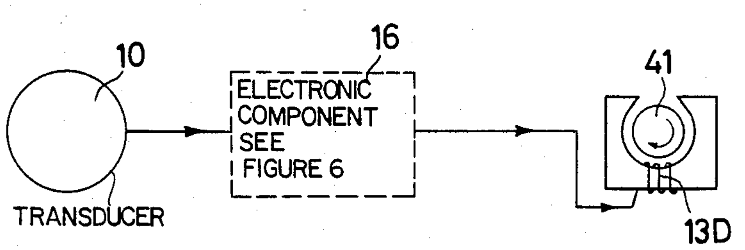
FIG. 5 shows a fourth application of the device of FIG. 1.

Finally, FIG. 5 diagrammatically illustrates an application of the device 9 for locking a rotating element 41 of an operating member, eg for electrical switches, which as in the preceding case has to maintain its operating position constant under all operating conditions.

For this purpose, an electromagnetic brake is constructed in which the coil of the device according to the invention, indicated by 13D, generates a magnetic field which keeps the rotating element 41 at rest during the mechanical stress.

With regard to the electronic component 16, that stated generally for the application of FIG. 4 is applicable.

Figure 7:
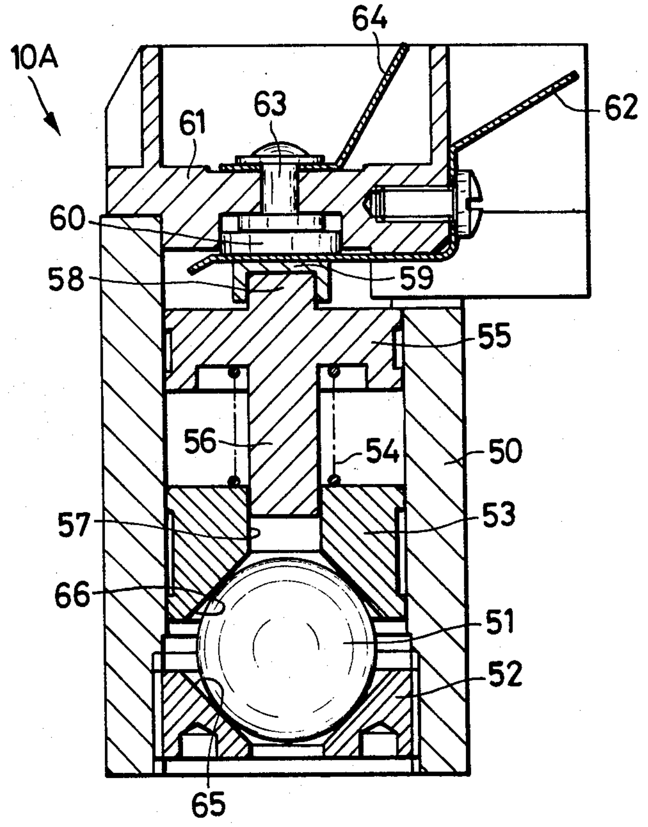
FIG. 7 is a constructionally detailed longitudinal section through an element of the device of FIG. 1.

FIG. 7 shows a preferred embodiment of the transducer 10, indicated by 10A.

The transducer 10A comprises a hollow support 50 for mounting rigid with the mechanical structures on which the linkage to be locked is disposed. The support 50 houses a ball 51 retained on one side by a losure ring nut 52 screwed into one end of the support 50. On the other side of a ball 51 there acts a main piston 53 slidable in the support 50. The ball 51 is enclosed between two frusto-conical surfaces 65 and 66 respectively of the ring nut 52 and main piston 53, and inclined to the axial sliding direction of this latter. On the main piston 53 there acts a setting spring 54 which interacts with a secondary piston 55 slidable in the support 50 coaxially to the main piston 53. The secondary piston 55 comprises an axial stem-shaped piston 56 guided in a corresponding seat 57 of the main piston 53 and surrounded by the spring 54. An axial head portion 58 of the secondary piston 55, covered by an insulating cap 59, exerts a pressure on a piezoelectric element 60. The piezoelectric element 60 is mounted on an insulating support 61 fixed rigidly to the support 50 in such a manner as to close this latter at its other end. The piezoelectric element 60 is held between a first contact strip 62 fixed to the support 61 and a conducting rivet 63 which externally fixes a second contact strip 64.

During assembly, the described transducer is set by loading the spring 54 to a predetermined value using the ring nut 52, which by being screwed to a greater or lesser depth into the support 50 determines a greater or lesser compression of the spring 54 by way of the ball 51 and the main piston 53. The loading of the spring 54 results in a pressure on the piezoelectric element 60 by way of the secondary piston 55.

In the case of mechanical stress in the structure to which the transducer 10A is rigidly fixed, the free masses, constituted by the ball 51 and the main and secondary pistons 53 and 55, move from their rest position of FIG. 7 to cause an increase or decrease in the pressure pre-existing on the piezoelectric element 60. This pressure variation generates in known manner a potential difference between the two surfaces of the piezoelectric element 60 in electrical contact with the two external strips 62 and 64.

The potential difference is then sensed and suitably used by the electronic component 16 of the device 9 in order to feed the coil 13, as heretofore described.

The transducer 10A is sensitive to mechanical stresses in any direction. This is due to the presence of the ball and to the particular inclination of the two surfaces 65 and 66 which enclose it. For any movement of the ball 51, the interaction between it and the surface 65 and 66 thus develops a longitudinal thrust component on the main piston 53, which is transmitted by the spring 54 to the secondary piston 55.

The response speed of the transducer 10A is very high, as a minimum movement of the free masses is sufficient to create a potential difference across the piezoelectric element 60.

For analogous reasons, mechanical-electrical transducers are generally of very rapid response, thus being clearly advantageous to the device according to the invention by virtue of this characteristic.

We claim:

1. An automatic locking device including a linkage subjected to undesirable mechanical stresses comprising a transducer rigid with a mechanical structure on which the linkage is disposed, said transducer including piezoelectric means emitting an electrical signal which is a function of the mechanical stresses, a coil fed by said electrical signal for generating an electromagnetic field for locking said linkage, said transducer including a casing housing a ball between a support element rigid with said casing a first piston slidable in said casing in opposed relationship to a second piston sidable in said casing, said second piston being coaxial to said first piston and pressing against said piezoelectric means; and means for elastically biasing said first and second pistons away from each other.

2. The automatic locking device as defined in claim 1 wherein said support element and said first slidable piston include surfaces inclined to the sliding direction of said first and second pistons between which said ball is enclosed.

3. The automatic locking device as defined in claim 1 wherein said support element is a ring nut threaded into said casing.

4. The automatic locking device as defined in claim 1 wherein said second piston includes a stem received in a bore of said first piston, and a spring surrounding said stem for normally biasing said first and second pistons away from each other.

5. The automatic locking device as defined in claim 1 including amplifier means and signal forming means through which said electrical signal is conducted from said transducer to said coil, said amplifier means and signal forming means including a direct current source, a first transistor fed by said direct current source and activated by said electrical signal, an electronic switch triggered by activation of said first transistor, second and third transistors activated by the triggering of said electronic switch, a capacitor charged by said direct current source, said second transistor being connected in a line between said direct current source and said capacitor, said electronic switch being connected into a connection line between said capacitor and said second and third transistors in order to connect the latter together once triggered and enable said capacitor to maintain said second and third transistors activated, and said third transistor being connected into a line of said coil which is connected to said direct current source so that said coil is energized for the period of activation of said third transistor.

6. The automatic locking device as defined in claim 5 including a variable resistor in the connection line between said transducer and said first transistor for regulating the intensity of the signal originating from said transducer and fed to said first transistor thereby regulating the mechanical stress level at which the device is activated.

7. The automatic locking device as defined in claim 5 including a variable resistor connected into the connection line between said capacitor and said second and third transistors in order to regulate the duration of the discharge of said capacitor and the duration of locking said linkage.

* * * * *